(12) United States Patent
Montmeat et al.

(10) Patent No.: US 11,562,899 B2
(45) Date of Patent: Jan. 24, 2023

(54) METHOD FOR TRANSFERRING THIN LAYERS

(71) Applicant: COMMISSARIAT A L'ENERGIE ATOMIQUE ET AUX ENERGIES ALTERNATIVES, Paris (FR)

(72) Inventors: Pierre Montmeat, Froges (FR); Frank Fournel, Villard-Bonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 41 days.

(21) Appl. No.: 16/467,254

(22) PCT Filed: Dec. 8, 2017

(86) PCT No.: PCT/EP2017/081999
§ 371 (c)(1),
(2) Date: Jun. 6, 2019

(87) PCT Pub. No.: WO2018/104513
PCT Pub. Date: Jun. 14, 2018

(65) Prior Publication Data
US 2019/0311895 A1    Oct. 10, 2019

(30) Foreign Application Priority Data
Dec. 8, 2016    (FR) ...................... 1662146

(51) Int. Cl.
| | | |
|---|---|---|
| *H01L 21/02* | (2006.01) | |
| *H01L 21/683* | (2006.01) | |
| *H01L 23/00* | (2006.01) | |
| *H01L 21/20* | (2006.01) | |
| *H01L 21/78* | (2006.01) | |

(52) U.S. Cl.
CPC .. *H01L 21/02118* (2013.01); *H01L 21/02282* (2013.01); *H01L 21/2007* (2013.01); *H01L 21/6835* (2013.01); *H01L 21/7806* (2013.01); *H01L 24/32* (2013.01); *H01L 2221/68318* (2013.01); *H01L 2221/68368* (2013.01)

(58) Field of Classification Search
None
See application file for complete search history.

(56) References Cited

U.S. PATENT DOCUMENTS 10,297,479 B2 * 5/2019 Dang ................. H01L 21/6835
10,615,111 B2 * 4/2020 Majumdar .......... H01L 23/3677
(Continued)

FOREIGN PATENT DOCUMENTS

FR    2 925 221 A1    6/2009

OTHER PUBLICATIONS

International Search Report dated Mar. 6, 2018, in PCT/EP2017/081999 filed on Dec. 8, 2017.
(Continued)

*Primary Examiner* — Bradley Smith
(74) *Attorney, Agent, or Firm* — Oblon, McClelland, Maier & Neustadt, L.L.P.

(57) ABSTRACT

A method for transferring a thin layer onto a destination substrate having a face with an adhesive layer includes formation of a polymer material interface layer on a second face of a thin layer, opposite a first face on which an adhesive is present. The method also includes assembly by gluing the interface layer and the adhesive layer and separation of the thin layer relative to a temporary support.

19 Claims, 6 Drawing Sheets

(56) References Cited

U.S. PATENT DOCUMENTS

Figure 1:
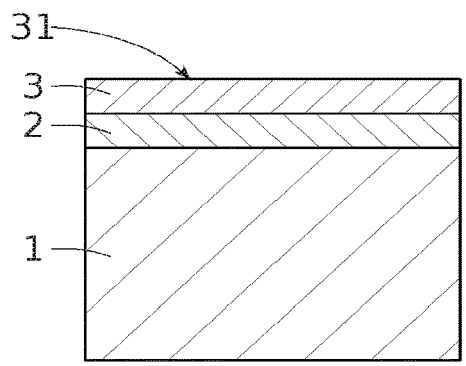

2006/0240275 A1 10/2006 Gadkaree
2009/0156016 A1 6/2009 Di Cioccio
2013/0092320 A1 4/2013 Argoud et al.
2015/0332885 A1 11/2015 Su et al.

OTHER PUBLICATIONS

Menon, L. et al., "Transferred Flexible Three-Color Silicon Membrane Photodetector Arrays", IEEE Photonics Journal, vol. 7, No. 1, Feb. 2015, total 7 pages.
Byun, K. Y. et al., "Single-Crystalline Silicon Layer Transfer to a Flexible Substrate Using Wafer Bonding", Journal of Electronic Materials, vol. 39, No. 10, 2010, pp. 2233-2236.
Ghaffari, A. et al., "Transfer of micro and nano-photonic silicon nanomembrane waveguide devices on flexible substrates", Optics Express, vol. 18, No. 19, Sep. 13, 2010, pp. 20086-20095.
Salvatore, G. A. et al., "Fabrication and Transfer of Flexible Few-Layers $MoS_2$ Thin Film Transistors to Any Arbitrary Substrate", ACS NANO, vol. 7, No. 10, Aug. 30, 2013, pp. 8809-8815.
Chen, W. et al., "Double-flip transfer of indium phosphide layers via adhesive wafer bonding and ion-cutting process", Applied Physics Letters, vol. 90, No. 052114, 2007, total 3 pages.
Colinge, C. et al., "Silicon Layer Transfer Using Wafer Bonding and Debonding", Journal of Electronic Materials, vol. 30, No. 7, 2001, pp. 841-844, XP-002496475.

\* cited by examiner

METHOD FOR TRANSFERRING THIN LAYERS

FIELD OF THE INVENTION

The present invention generally relates to the microelectronics industry, in particular for producing thin layer microelectronic devices (thin, for example, less than 500 nm, even less than 200 nm) carried by a flexible support, so as to obtain a flexible assembly.

By microelectronic device, this means any type of device produced with microelectronic means. These devices in particular, in addition to devices with a purely electronic purpose, comprise micromechanical or electromechanical (MEMS, NEMS, etc.) devices, as well as optical or optoelectronic (MOEMS, etc.) devices.

TECHNOLOGICAL BACKGROUND

For twenty years, flexible support electronics has seen a notable rise. Applications are varied: photovoltaic cells, organic diodes, biological sensors for in vivo measurements, etc. In this context, it often appears necessary to develop a hybrid assembly wherein the electronic device, with an often inorganic material basis, is associated with a flexible support made of a flexible material like a polymer. A good cohesion must be ensured between the inorganic material which is presented in the form of a more or less thick film and the flexible support.

In the case where the film is a crystallised semi-conductor, film transfer methods are often used.

It has, for example, been demonstrated that a thin silicon film could be transferred onto a flexible support. This is what the publication entitled "Transferred Flexible Three-Color Silicon Membrane Photodetector Arrays" IEEE Photonics Journal, Vol. 7, No 1, February 2015 proposes, with a Kapton® flexible support, covered with an adhesive layer which receives a nanomembrane during a transfer phase.

However, the techniques currently considered for transferring a microelectronic device on a flexible support are subject to reliability problems.

It is observed from cases of devices cracking during the transfer, in particular due to stresses caused on these thin layers generally made of fragile materials, when these layers are very thin, typically less than 500 nm, even less than 200 nm.

A method for transferring a thin layer is known from patent document US 2013/0092320 A1. The latter uses an adhesive layer to bond two faces opposite two substrates to be assembled.

It is an aim of the invention that to overcome at least partially the disadvantages of the current techniques, by improving the transfer of microelectronic devices particularly on flexible supports.

SUMMARY OF THE INVENTION

A non-limiting aspect of the invention relates to a method for transferring a thin layer onto a destination substrate on a face of which an adhesive layer is present.

Advantageously, it comprises, from a temporary support to a face of which a first face of the thin layer is secured:
- a formation of an interface layer made of polymer material on a second face of the thin layer, opposite the first face;
- an assembly by bonding the interface layer and the adhesive layer; and
- a separation of the thin layer relative to the temporary support.

Thus, two layers are associated for the assembly between the temporary support and the destination substrate. Indeed, a first interface layer falls into the continuity of the thin layer, so as to resume and distribute the mechanical stresses caused by bonding onto the destination substrate. Furthermore, this interface layer improves the planarity, and more generally the surface state of the contact area with the adhesive layer by moulding the roughness. The roughness is reduced to improve contact with the second adhesive layer, that the destination substrate carries. In the absence of the interface layer, this would be the bonding itself which would mould the topology of the surface of the thin layer, by including stresses. Relaxing the stresses during the separation would result in the cracking of the thin layer.

Another separable aspect of the present invention relates to a device obtained by the method.

BRIEF INTRODUCTION OF THE FIGURES

Other characteristics, aims and advantages of the present invention will appear upon reading the following detailed description, regarding the appended drawings, given as non-limiting examples, and wherein:

FIGS. 1 to 6 illustrate potential successive steps so as to obtain a temporary support to which is secured a thin layer;

FIGS. 7 to 11 present potential successive steps to obtain a transfer of the thin layer on a destination substrate;

FIGS. 12 to 17 illustrate potential successive steps so as to obtain a temporary support to which is secured a thin layer, as an alternative to the case of FIGS. 1 to 7; and FIGS. 18 to 22 present another embodiment of potential successive steps to obtain a thin layer on a destination substrate.

The drawings are given as examples and are not limiting of the invention. They constitute principle schematic representations intended to facilitate the understanding of the invention and are not necessarily to the scale of the practical applications.

DETAILED DESCRIPTION

Before starting a detailed review of embodiments of the invention, optional characteristics are stated below, which can possibly be used according to any association or alternatively:
- the formation of the interface layer 7 comprises a spreading of a liquid form of the polymer material over the second face 32 of the thin layer 3, then a structuring of the solid phase polymer material;
- a temporary support 4 is used, comprising a separation layer 5 and a handle 41, the separation layer 5 being arranged between the thin layer 3 and the handle 41 of the temporary support 4 when they are secured, and wherein the separation is achieved by a decohesion of the separation layer 5 relative to the thin layer 3 or to the handle 41;
- the separation layer 5 is arranged in contact with the first face 31 of the thin layer 3 when the temporary support 4 and the thin layer 3 are secured and wherein a temporary support 4 is used, comprising an assembly layer arranged between the separation layer 5 and the handle 41, and wherein the decohesion occurs at the interface between the separation layer 5 and the assembly layer 6;

the separation layer 5 is arranged in contact with the handle 41 when the temporary support 4 and the thin layer 3 are secured and wherein a temporary support 4 is used, comprising an assembly layer 6 arranged between the separation layer 5 and the thin layer 3, and wherein the decohesion occurs at the interface between the separation layer 5 and the assembly layer 6;

the method comprises a securing of the destination substrate 9 onto a support frame 10 by bonding a surface of the support frame 10 onto the adhesive layer 8;

the securing is done at the same time as the assembly;

a preliminary transfer of the thin layer 3 is done from an initial substrate 1 to the temporary support 4;

an initial substrate 1 is used, comprising a base layer and a buried electrical insulating layer 2, the second face 32 of the thin layer 3 being arranged in contact with the buried electrical insulating layer 2;

a disconnection of the thin layer 3 relative to the initial substrate 1 is made by tapering the base layer and the buried electrical insulating layer 2 or by breaking the electrical insulating layer;

a polymer material adhesive layer 8 is used, preferably with a thickness greater than or equal to 10 μm and/or less than or equal to 200 μm;

the thickness of the interface layer 7 is selected greater than 100 nm, and preferably greater than or equal to 10 μm;

the thickness of the interface layer 7 is selected less than or equal to 200 μm, and preferably less than or equal to 100 μm;

the thin layer 3 is selected with a thickness less than 500 nm and possibly less than or equal to 200 nm;

the thin layer 3 is selected on the basis of at least one from among: a semi-conductive material, a magnetic material, a piezoelectric material; and the destination support 9 is selected in the form of a sheet of polymer material, or polymer film.

It is specified that, in the scope of the present invention, the term "on" or "above" does not compulsorily mean "in contact with". Thus, for example, the deposition of a layer on another layer, does not compulsorily mean that the two layers are directly in contact with one another, but this means that one of the layers covers at least partially the other by being either directly in contact with it, or by being separated from it by a film, also another layer or another element. A layer can moreover be composed of several sublayers made of one same material or of different materials.

It is specified that in the scope of the present invention, the thickness of a layer or of a substrate is measured along a direction perpendicular to the surface along which this layer or this substrate has the maximum extension thereof.

Using the singular for certain elements of the invention does not compulsorily mean that a given element is present by itself in the invention. The word "a/an" or "one" does not therefore exclusively mean respectively "a single" or "one single", unless it is arranged otherwise.

Below, implementation examples of the method of the invention are given to achieve the transfer of a thin layer (otherwise called thin film) on a destination substrate. A result that can be obtained from the method of the invention is illustrated similarly to FIGS. 1 and 22. In these figures, a thin layer 3 has been returned on the lower face of a destination substrate 9. This return has been made by way of an interface layer 7 and an adhesive layer 8.

The thin layer 3 corresponds to a microelectronic device, for example on the basis of semi-conductive, piezoelectric or also electromagnetic materials. The thin layer 3 can comprise active or passive electrical components, such as photovoltaic cells, diodes, MEMS or more simply, component electrical circuits such as transistors or also be a layer of a given material only. Advantageously, the thin layer 3 has a thickness of less than 500 nm and preferably less than 200 nm.

A non-limiting interest of the thin layer 3 is to preserve a certain capacity for deformation by bending this layer. Indeed, there is a growing need for flexible microelectronic devices. To preserve the bending capacity while offering a support for the thin layer 3, the destination substrate 9 of the invention is also advantageously flexible. The destination substrate 9 can be formed from at least one layer made of a polymer material. It can consist of or comprise a metal layer. These examples of materials are clearly not limiting. Likewise, by way of indication, it is indicated that the thickness of the destination substrate 9 can be less than 300 microns and/or greater than 50 microns. This flexible substrate 9 can be secured to a rigid structure 10 which makes it possible to easily handle the substrate 9 assembly associated with the thin layer 3 and to carry out new technological steps on the thin layer (deposition, stressing, cutting, etc.).

The association of the destination substrate 9 and of the thin layer 3 therefore makes it possible, according to an advantageous embodiment, to arrange an assembly of which the mechanical resistance is adapted to the applications, but which remains deformable by bending. An aspect linked to the mechanical resistance of the assembly is the combination of the layers 7 and 8 represented in FIGS. 11 and 22. Indeed, according to the invention, these layers engage so as to avoid the cracking of the thin layer 3 during or after the return operations on the destination substrate 9. Preferably, the interface layer 7 produces a flat surface above the whole of a face of the thin layer 3. Advantageously, the interface layer 7 engages over the whole of the face thereof opposite the thin layer 3 with the adhesive layer 8.

The layer 8 has the purpose of bonding the assembly formed by the thin layer 3 and the interface layer 7 on the destination substrate 9. It also ensures the securing of the substrate 9 onto the rigid structure 10. It can be an adhesive polymer, for example, an acrylate. For example, the thickness of the layer 8 is of between 10 microns and 200 microns. Preferably, the thickness of the layer 8 is greater than that of the layer 7. The layer 8 can be obtained on the base of a complex support associating the destination substrate and the adhesive layer, as, for example, commercialised by the company Lintec Corporation® under the reference Adwill® 675 or by the company Furukawa® under the reference SP537T230. However, a substrate in the form of one single sheet or polymer film can be used and itself return an adhesive layer 8.

Concerning the interface layer 7, a polymer material can also be used. As an example, it can be a polymer of reference BSI5150 commercialised by Brewer® or also of reference LC5200 commercialised by 3M®. The thickness of this layer can, for example, be greater than 100 nm, advantageously greater than 10 microns. According to an option, the thickness of the interface layer 7 is selected greater than 1 micrometre, and is preferably of between 3 and 7 micrometres; it can measure 5 micrometres. The thickness of this layer can possibly be limited to 100 microns. Advantageously, the roughness of type Ra of the face of the interface layer 7 intended for the assembly with the adhesive layer 8 is less than 50 nm.

FIGS. 1 to 6 present a succession of steps which can be implemented so as to achieve the thin layer 3, that is sought to be transferred onto the destination substrate 9, being carried by a temporary support 4. In particular, an assembly of the silicon on insulator (SOI) type can be started, comprising in a stack, an initial substrate 1, a buried electrically insulating layer 2 and the thin layer 3. The base layer of the initial substrate 1 is, for example, made of silicon or of another semi-conductive material. The buried electrically insulating layer 2 is typically made of silicon dioxide. This layer can, for example, have a thickness of 200 nm. On this two-layer assembly is located the thin layer 3 secured to the second face 32 thereof of the upper face of the buried insulating layer 2.

Figure 2:
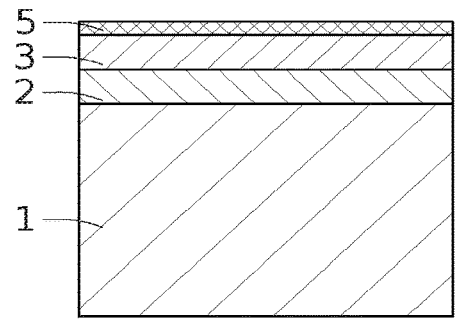

FIG. 2 illustrates a step during which is added to the preceding stack, a separation layer 5 which will later make it possible to disconnect the thin layer 3 of the temporary support 4. A polymer material can be used for the separation layer 5 such as products of the company 3M® bearing the references NOVEC EGC® 2702 and NOVEC EGC® 1700 or OPTOOL DSX® of the company Daikin®.

Figure 3:
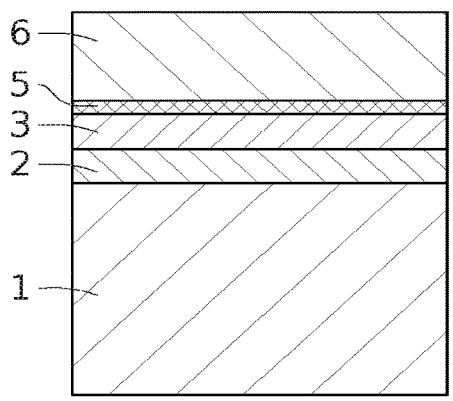
Figure 4:
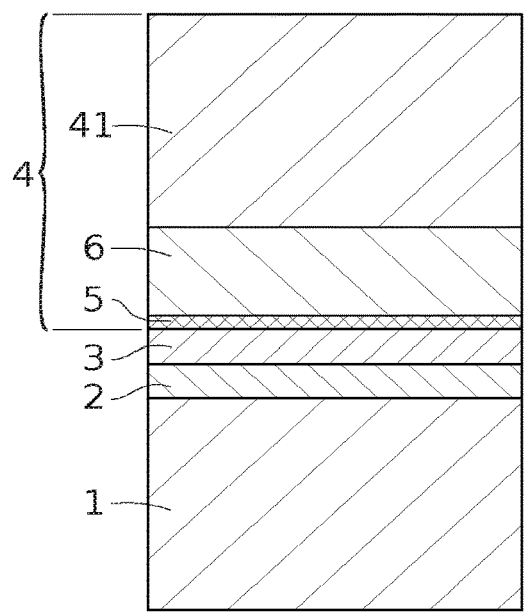

Then, an assembly layer 6 is returned in the step of FIG. 3. It forms a temporary adhesive making it possible, as illustrated in FIG. 4, the securing with the handle 41. For this layer, adhesives of the company Brewer® can be used, bearing the references Bsi5150 or Bsi305 or that of the company 3M® bearing the reference LC5200. Advantageously, it is arranged such that the bonding energy between the assembly layer 6 and the separation layer 5 is less than the bonding energy existing between the assembly layer 6 and the face of the handle 41.

Figure 5:
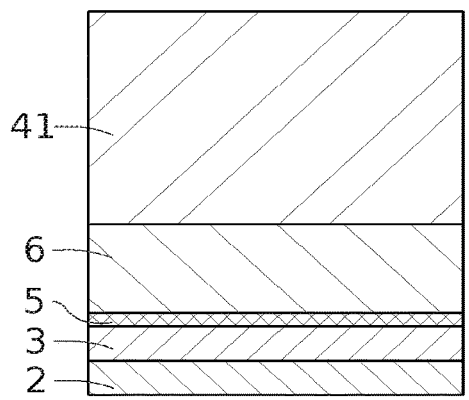
Figure 6:
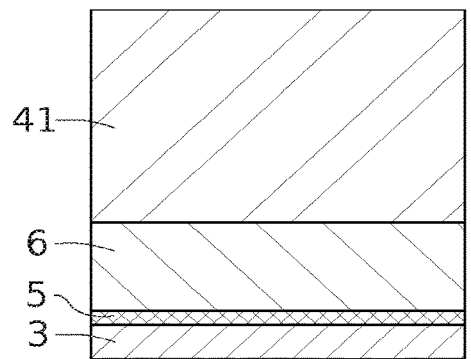

Finally, the thin layer 3 is found to be carried by the temporary support 4 and the initial substrate can be removed. In the case of an SOI technique, therefore at this stage, the base layer made of a semi-conductive material and the buried layer 2 are removed. FIG. 5 shows an intermediate step of this removal process, wherein only the layer 2 subsists. A series of steps of tapering by grinding and chemical etching can, for example, be proceeded with. Furthermore, an ionic implantation can be carried out in the layer 2 so as to cause a breaking at this level and to remove the initial substrate. Finally, the result presented in FIG. 6 is obtained at the level of which the thin layer 3 is exposed above the temporary support 4, the second face 32 thereof being accessible. The example thus given is purely indicative and any other embodiment making it possible to obtain the support of the thin layer 3 on a temporary support 4, advantageously rigid, enters back into the case of the present invention.

Figure 7:
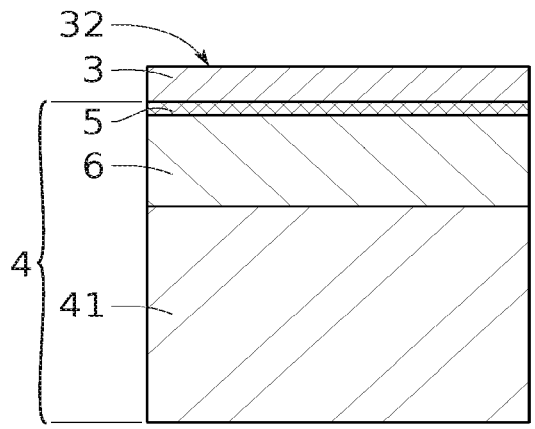

FIG. 7 does not substantially differ from FIG. 6, but the stack of layers undergoes a rotation of 180° there.

Figure 8:
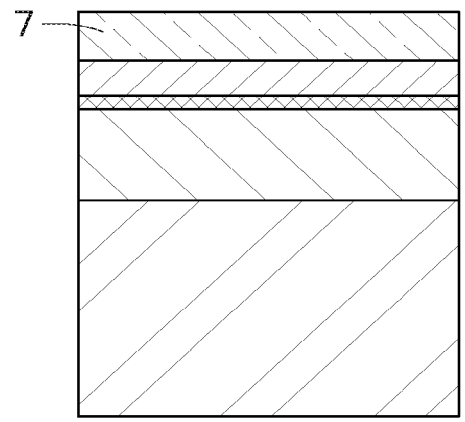

On this base, above the second face 32 of the thin layer 3, the interface layer 7 is formed, in reference to FIG. 8. This formation can comprise the deposition of a liquid form of a polymer (in particular, polymer in the solution or liquid precursor) on the face 32 and the spreading thereof, for example by centrifugal coating so as to present a distribution that is as homogenous as possible. The layer thus spread is structured. This structuring will depend on the liquid form of the polymer. In the case of a polymer in the solution, the material is structured by solidifying it by removing the solvent from the solution, in particular by one or more annealing steps (such as in the case of polymer Bsi5150). In the case of precursors, the material will be structured by curing, in particular by curing the precursors (annealing or insolation for the polymer LC5200, for example). Advantageously, in both cases, the polymerisation or generally, the structuring is complete and makes it possible to obtain an upper face of the assembly having an improved surface state relative to that of the second face 32 of the thin layer 3.

Figure 9:
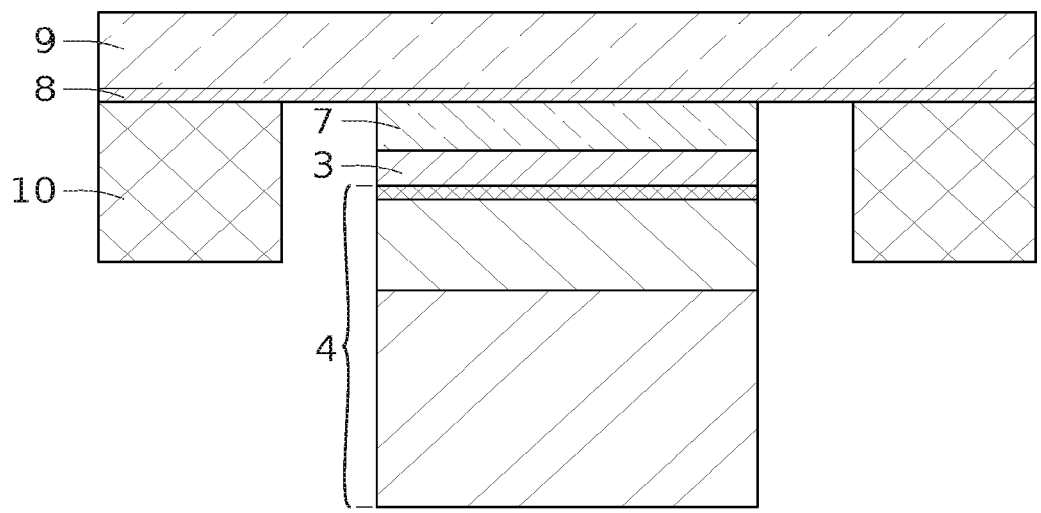

The transfer on the destination substrate 9 per se is presented in FIG. 9. The substrate 9 can thus be laminated on the interface layer 7 by the face of the substrate 9 which comprises the adhesive layer 8. It is the latter which has just been applied on the face of the interface layer 7 opposite the thin layer 3. Advantageously at the same time, it is possible to position the destination substrate 9 on a rigid frame 10 making it possible for the peripheral support of the substrate 9 and making other technological steps possible. Thus, the adhesive layer 8 is advantageous for two simultaneous operations.

Figure 10:
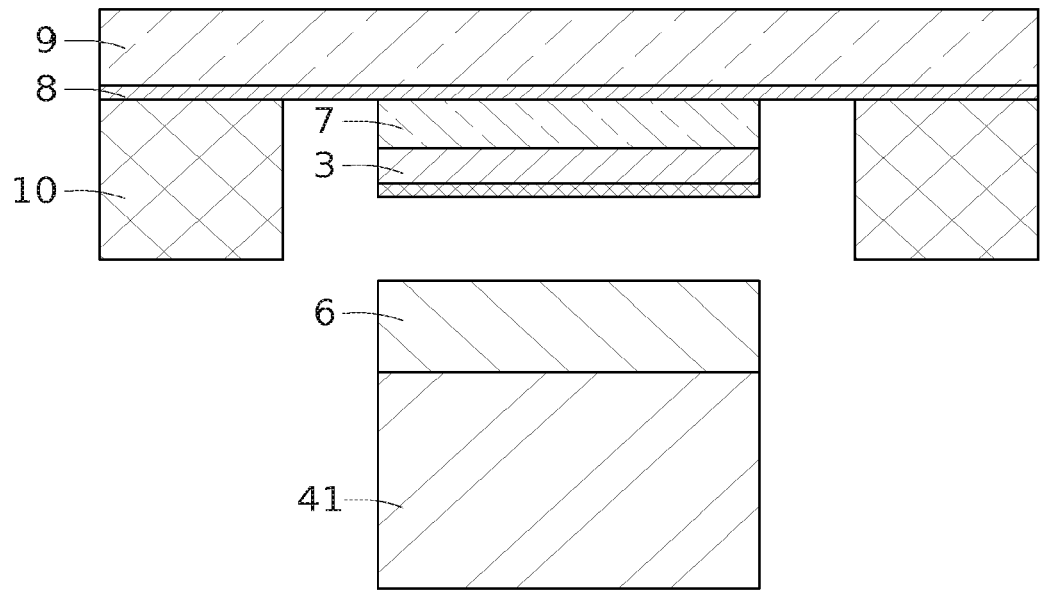
Figure 11:
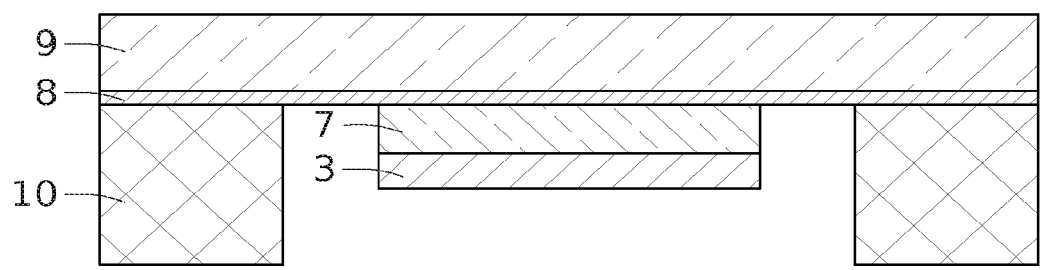
Figure 12:
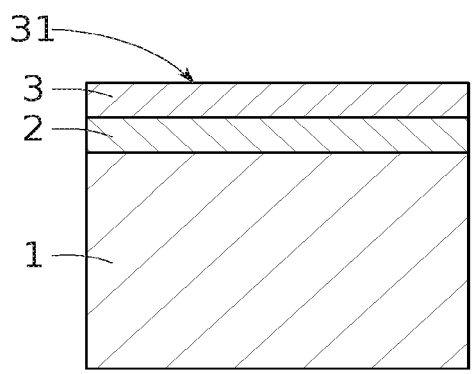

In FIG. 10, the temporary support 4 can be removed by separation between the separation layer 5 and the assembly layer 6. The latter remains secured to the handle 41 of the support 4 while the separation layer 5 remains on the thin layer 3. Possibly, the separation layer 5 can be removed, for example, by a plasma or chemical treatment. Subsequently, the thin layer 3 is carried by the destination substrate as FIG. 11 shows.

The result of steps described above can be adapted according to the type of materials implemented, in particular for the interface layer 7. Thus, on the tapered substrate presented in FIG. 7, a film of interface layer 7 of the 3M® material LC-5200, for example of 10 μm can be spread by centrifugal coating. The polymer is thus reticulated in particular under UV (ultraviolet). Then, a complex, flexible destination substrate of the type, Furukawa® SP537T230 can be laminated both on this polymer layer 7 and on a rigid frame 10 by the adhesive layer of the Furukawa® SP537T230 material. The contact between the substrate 9 and the polymer of the interface layer 7, on the one hand, and the contact between the substrate 9 and the frame 10 are ensured by the adhesive of the flexible substrate. The rigid handle 41 is dismounted and the thin layer is thus recovered (for example, made by a bonded silicon film of 200 nm; thus no defect is observed on the thin silicon film).

According to another example, from the tapered substrate presented in FIG. 7, a 3M® LC-5200 polymer film, for example, of 100 μm can be spread by centrifugal coating, to form the interface layer 7. The polymer is thus reticulated, for example, under UV. A flexible substrate 9 is laminated (for example, of the type, Furukawa SP537T230) both on this polymer layer and on a rigid frame 10. The contact between the flexible substrate 9 and the polymer of the layer 7, on the one hand, and the contact between the flexible substrate 9 and the frame 10 are ensured by the adhesive layer 8 carried by the substrate 9. The handle is removed from the rigid temporary support 4 and the thin layer is thus returned (for example, a silicon film of 200 nm bonded on the 3M® LC-5200 adhesive, and thus secured to the flexible substrate 9; thus no defect on the thin silicon film is observed).

FIGS. 12 to 22 present another embodiment.

Figure 13:
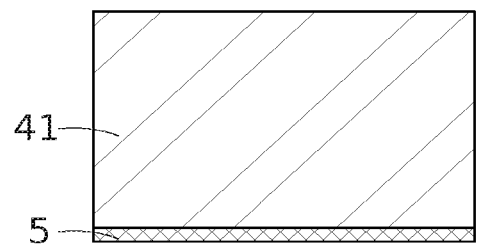
Figure 14:
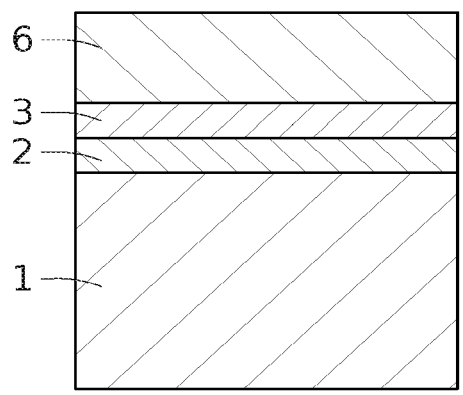
Figure 15:
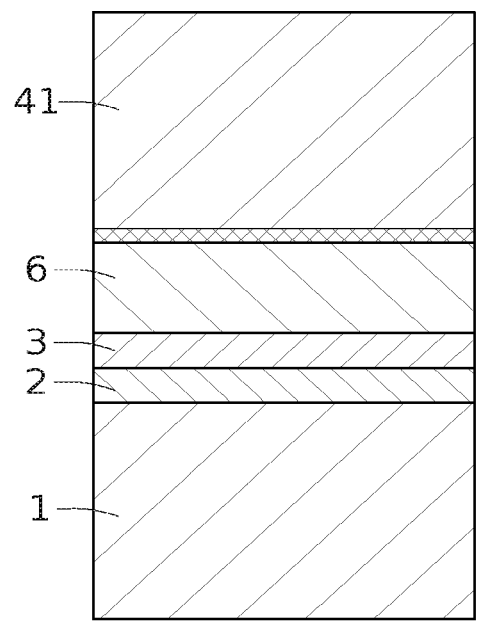
Figure 16:
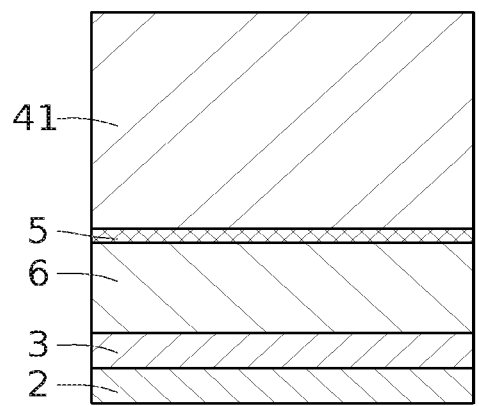
Figure 17:
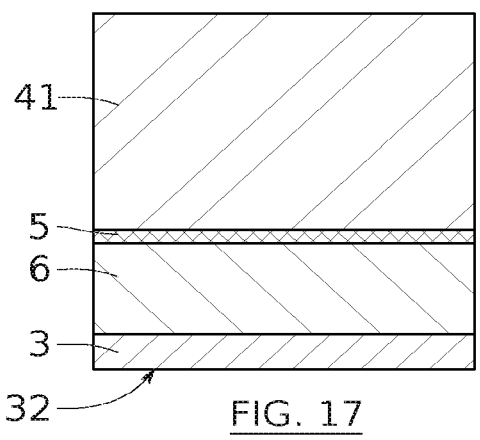

As above, a series of optional steps of the invention makes it possible to achieve the configuration wherein the thin layer 3 has a second face 32 exposed above a temporary support 4 as FIG. 17 shows. To achieve this, an initial situation can be started with, presented in FIG. 12, identical to that presented in FIG. 1. This time, the separation layer 5 is arranged on one of the faces of the temporary support 4, as illustrated in FIG. 13. In FIG. 14, the assembly layer 6 is produced above the thin layer 3 of the stack presented in FIG. 12. Finally, the stacks of FIGS. 13 and 14 are assembled by the exposed faces of the assembly layer 6 and of the separation layer 5 so as to obtain the configuration of FIG. 15. Thus returned on the temporary support 4, the thin layer 3 can be separated from the initial substrate 1 and in particular, from the base layer of this substrate, as in FIG. 16, then from the buried electrically insulating layer 2 as in FIG. 17. The methods described in reference to FIGS. 1 to 6 can be applied mutatis mutandis in the case of FIGS. 12 to 17.

Figure 18:
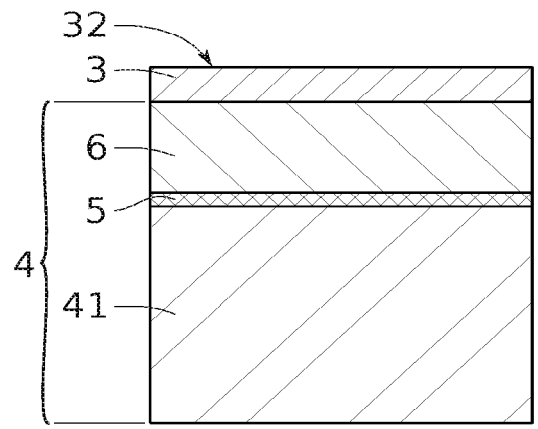
Figure 19:
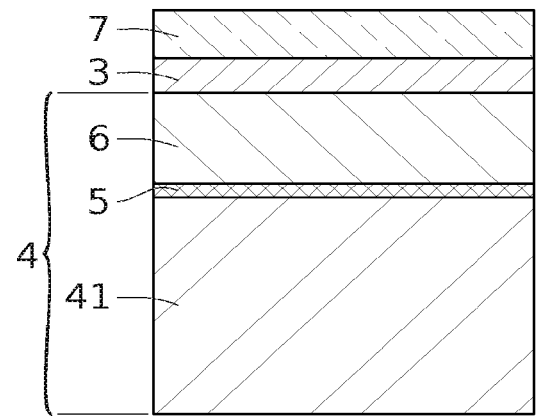
Figure 20:
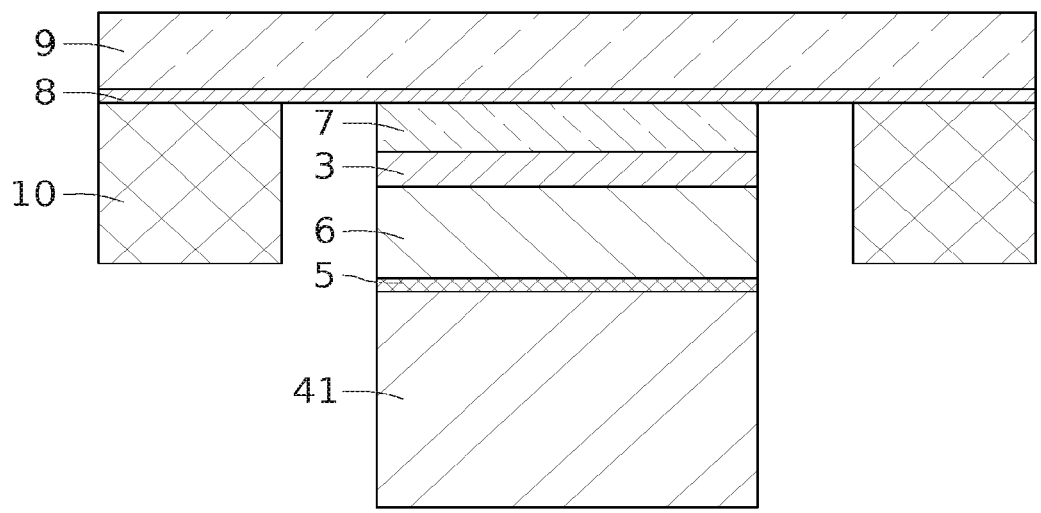

FIG. 18 presents a configuration, equivalent to that of FIG. 17, except for a returning of the stack has been achieved. Similarly to what was presented in FIGS. 8 and 9, in FIGS. 19 and 20, first the formation of the interface layer 7 is achieved, then the transfer of the assembly onto the destination substrate 9 by way of the adhesive layer 8.

Figure 21:
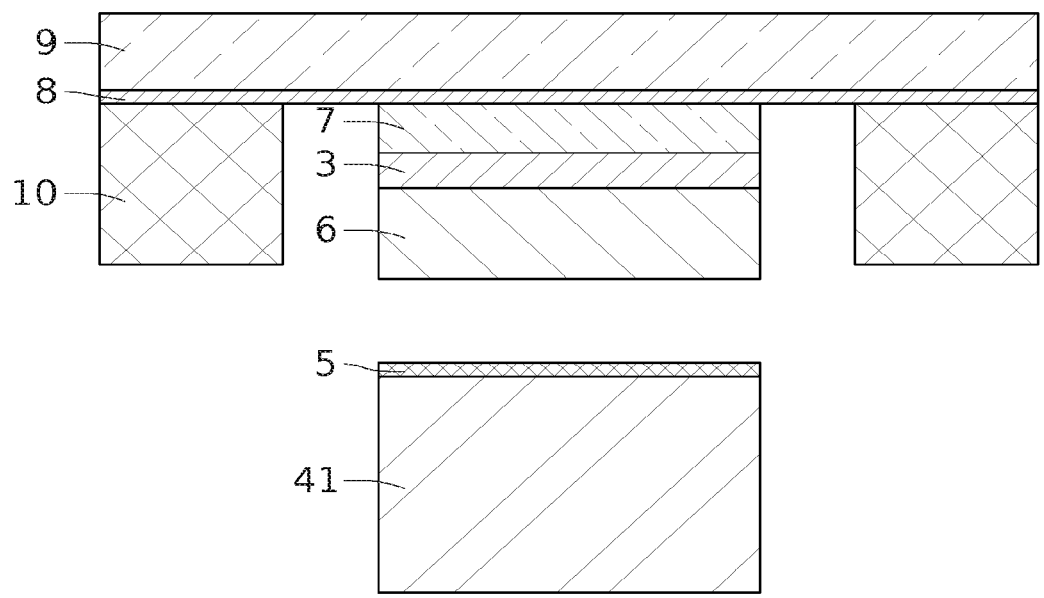
Figure 22:
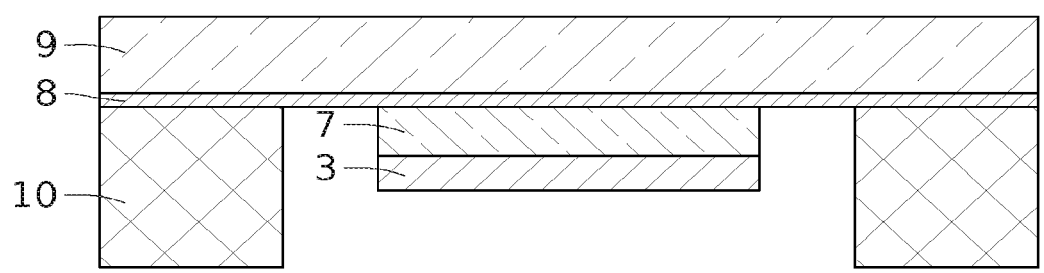

Contrary to the case of FIG. 10, the separation produced in FIG. 21 preserves the separation layer 5 secured to the temporary support 4 while the interface layer 7 remains in contact with the thin layer 3. However, the layer 7 can be removed, in particular chemically so as to expose the face of the thin layer 3. Outside of these differences, the methods described in reference to FIGS. 7 to 11 can be implemented mutatis mutandis for the embodiment of FIGS. 18 to 22.

According to a specific example, adapted to this embodiment, a polymer layer (for example, of the type Bsi305) is spread by centrifugal coating on the tapered rigid substrate of FIG. 18, in particular of 50 µm, then it is annealed to 220° C. to form the layer 7 by removing the solvent. A complex and flexible substrate 9 is laminated (for example, of the type Furukawa SP537T230) both on this layer 7 and on a frame 10. The contact between the flexible substrate and the second polymer, on the one hand, and the contact between the flexible substrate 9 and the frame 10 are ensured by the adhesive layer 8 present on the flexible substrate 9. The handle 41 is removed from the rigid temporary support 4 and the thin layer 3 here is recovered, for example, a silicon film of 200 nm confined between the polymer material layer 7 and the temporary assembly layer (for example, made of Bsi5150 material) and secured to the destination substrate 9 provided with the adhesive layer 8). The cleaning of the assembly layer, which is a temporary adhesive (for example, Bsi5150) in the surface area of the thin film or thin layer 3 is produced, preferably chemically. Thus, no defect on the thin silicon film secured to the flexible substrate by way of the polymer (in particular, Bsi305) of the interface layer 7 is observed.

Except for any indication on the contrary, the technical characteristics described in detail for the given embodiment can be combined with the technical characteristics described in the context of other embodiments described as non-limiting examples, those of which are explained in detail above.

REFERENCES

1. Initial substrate
2. Buried insulating layer
3. Thin layer
4. Temporary support
5. Separation layer
6. Assembly layer
7. Interface layer
8. Adhesive layer
9. Destination substrate
10. Support frame
31. First face
32. Second face
41. Handle

The invention claimed is:

1. A method for transferring a thin layer to a destination substrate on a face of which an adhesive layer is present, from a temporary support to a face of which a first face of the thin layer is secured, the method comprising:
    forming a polymer material interface layer on a second face of the thin layer, opposite the first face, comprising spreading a liquid form of the polymer material on the second face of the thin layer, then structuring a solid phase of the polymer material; then
    forming an assembly by bonding the interface layer directly to the adhesive layer; then
    separating the thin layer from the temporary support.

2. The method according to claim 1, wherein the temporary support comprises a separation layer and a handle, the separation layer arranged between the thin layer and the handle of the temporary support, and wherein the separating is achieved by separating the separation layer from the thin layer or from the handle.

3. The method according to claim 2, wherein the separation layer is arranged in contact with the first face of the thin layer when the temporary support and the thin layer are secured to each other, the temporary support further comprising an assembly layer arranged between the separation layer and the handle, and wherein the separating occurs at an interface between the separation layer and the assembly layer.

4. The method according to claim 2, wherein the separation layer is arranged in contact with the handle when the temporary support and the thin layer are secured to each other, the temporary support further comprising an assembly layer arranged between the separation layer and the thin layer, and wherein the separating occurs at an interface between the separation layer and the assembly layer.

5. The method according to claim 1, comprising securing of the destination substrate onto a support frame by bonding a surface of the support frame on the adhesive layer.

6. The method according to claim 5, wherein the securing of the destination substrate onto the support frame is done at the same time as the assembly.

7. The method according to claim 1, comprising a preliminary transfer of the thin layer from an initial substrate to the temporary support.

8. The method according to claim 7, wherein the initial substrate comprises a base layer and a buried electrical insulating layer, the second face of the thin layer being arranged in contact with the buried electrical insulating layer prior to the preliminary transfer.

9. The method according to claim 8, comprising a disconnection of the thin layer from the initial substrate by tapering the base layer and the buried electrical insulating layer or by breaking the buried electrical insulating layer.

10. The method according to claim 1, wherein the adhesive layer is a polymer material adhesive layer, with a thickness greater than or equal to 10 µm.

11. The method according to claim 1, wherein a thickness of the interface layer is greater than 100 nm.

12. The method according to claim 1, wherein a thickness of the interface layer is less than 1 µm.

13. The method according to claim 1, wherein a thickness of the interface layer is less than or equal to 200 µm.

14. The method according to claim 1, wherein the thin layer has a thickness less than 500 nm.

15. The method according to claim 1, wherein the thin layer is at least one from among: a semi-conductive material, a magnetic material, and a piezoelectric material.

16. The method according to claim 1, wherein the destination substrate is a sheet of polymer material.

17. The method according to claim 1, wherein a thickness of the interface layer is greater than or equal to 10 μm.

18. The method according to claim 1, wherein the adhesive layer is a polymer material adhesive layer, with a thickness that is less than or equal to 200 μm.

19. A method for transferring a thin layer to a destination substrate, comprising:
- obtaining an assembly having a first face of the thin layer disposed on a face of a support substrate;
- forming an interface layer comprised of a solid phase of a polymer material on a second face of the thin layer opposite the first face;
- forming an adhesive layer on the destination substrate;
- attaching the interface layer directly to the adhesive layer; and
- separating the thin layer from the support substrate.

\* \* \* \* \*